US007218183B2

(12) United States Patent
Kim et al.

(10) Patent No.: US 7,218,183 B2
(45) Date of Patent: May 15, 2007

(54) TRANSMISSION LINE IMPEDANCE MATCHING

(75) Inventors: Hyunjun Kim, Chandler, AZ (US); Joong-Ho Kim, Phoenix, AZ (US); Dong-Ho Han, Phoenix, AZ (US); Jiangqi He, Gilbert, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 11/352,182

(22) Filed: Feb. 10, 2006

(65) Prior Publication Data

US 2006/0125574 A1 Jun. 15, 2006

Related U.S. Application Data

(62) Division of application No. 10/880,637, filed on Jun. 29, 2004, now Pat. No. 7,142,073.

(51) Int. Cl.
*H03H 7/38* (2006.01)

(52) U.S. Cl. ........................................ 333/33; 333/246

(58) Field of Classification Search .................. 333/33, 333/34, 35, 246
See application file for complete search history.

(56) References Cited

U.S. PATENT DOCUMENTS

| | | | |
|---|---|---|---|
| 3,093,805 | A | 6/1963 | Osifchin et al. |
| 4,862,120 | A | 8/1989 | Ruxton et al. |
| 6,531,932 | B1 | 3/2003 | Govind et al. |
| 6,639,487 | B1 | 10/2003 | Salmela et al. |
| 6,642,819 | B1 | 11/2003 | Jain et al. |
| 6,867,661 | B2 | 3/2005 | Dawn et al. |
| 2003/0030506 | A1 | 2/2003 | Dawn et al. |
| 2004/0075520 | A1 | 4/2004 | Nothhhelfer et al. |

FOREIGN PATENT DOCUMENTS

| | | |
|---|---|---|
| JP | 61177001 | 8/1986 |
| JP | 61277202 | 12/1986 |
| JP | 2002026640 | 1/2002 |

OTHER PUBLICATIONS

"PCT International Search Report", International Searching Authority, Sep. 30, 2005, 4 pgs., PCT/US2005/020452.

"Written Opinion of the International Searching Authority", International Searching Authority, Sep. 30, 2005, 5 pgs., PCT/US2005/020452.

*Primary Examiner*—Stephen E. Jones
(74) *Attorney, Agent, or Firm*—Blakely, Sokoloff, Taylor & Zafman LLP

(57) ABSTRACT

Transmission line impedance matching for matching an impedance discontinuity on a transmission signal trace with one or more non-transmission traces disposed near the transmission signal trace at a region corresponding to the impedance discontinuity.

7 Claims, 8 Drawing Sheets

TRANSMISSION LINE IMPEDANCE MATCHING

CROSS-REFERENCE TO RELATED APPLICATIONS

This application is a divisional of U.S. patent application Ser. No. 10/880,637, filed on Jun. 29, 2004 now U.S. Pat. No. 7,142,073, which is hereby incorporated by reference.

TECHNICAL FIELD

Embodiments of the present invention pertain to the field of circuits and, more particularly, to impedance matching techniques for an impedance discontinuity on a transmission signal trace.

BACKGROUND

As the operating frequencies used to transmit digital signals across circuits increases, the signal integrity of the transmission signal becomes more important. In particular, transmission signal integrity issues become more important at operating frequencies in the gigahertz frequencies and higher.

Referring to FIG. 1, transmission signals may be propagated on a transmission signal trace 105 within a circuit having a reference plane 110. An electric field 130 and a magnetic field 135 are created when current passes through the transmission signal trace 105. The illustrated electric field 130 and magnetic field 135 are representative of electromagnetic fields that may exist around the transmission signal trace 105. Specifically, the electric field 130 exists within a dielectric layer (not shown) between the transmission signal trace 105 and the reference ground plane 110. The magnetic field 135 exists around the transmission signal trace 105.

Transmitting signals on a transmission signal trace at higher frequencies is complicated by the relative ease with which noise and other interference may distort the transmission signal. Impedance discontinuities are one source of distortion that may degrade the quality of a transmission signal on a transmission signal trace. An impedance discontinuity, as used herein, is a variation in impedance (resistance and reactance) along a transmission signal trace that results in a distortion of the transmission signal at the location of the impedance discontinuity. An impedance discontinuity also may result in a loss of transmission power of the transmission signal.

The impedance of a transmission signal trace may depend on a variety of factors, including trace length, trace thickness, trace width, dielectric layer material properties, and so forth. An impedance discontinuity may occur where the transmission signal trace properties vary. For example, as shown in FIG. 2*a*, an impedance discontinuity may occur at a geometric, or physical, discontinuity (e.g., bend or taper) on the transmission signal trace 205. A fringing electric field 215 may result at the impedance discontinuity when a current is applied to the transmission signal trace 205.

FIG. 2*b* depicts a cross-sectional view of the electric field 230, including the fringing electric field 215, that exists between the transmission signal trace 205 and the reference plane 210. The fringing electric field 215 exists outside of the region directly between the transmission signal trace 205 and the reference plane 210. In particular, the fringing electric field 215 is more widely distributed than the representative electric field 130 shown in FIG. 1. It should be noted that even if there is perfect impedance matching in the transmission signal trace 105 of FIG. 1, some fringing fields might still be present. However, there may be more fringing fields in the presence of an impedance discontinuity, as illustrated in FIG. 2*a*. As stated above, this fringing electric field 215 results from the impedance discontinuity in the transmission signal trace 205 and acts to distort the transmission signal and reduce the transmission power of the transmission signal on the transmission signal trace 205. Furthermore, this fringing electric field 215 and a corresponding distorted magnetic field (not shown) may cause interference in the form of cross-talk on other nearby transmission signal traces (not shown).

Conventionally, impedance matching on a transmission signal trace may be accomplished through one or more techniques that employ empirical adjustment of the transmission signal trace parameters. For example, the transmission signal trace may incorporate design variations of width, thickness, and so forth, which are calculated to compensate for other impedance discontinuities. However, many of the physical attributes of a transmission signal trace may be predetermined in designing the overall circuit. For example, the routing and bends of the transmission signal trace may be predetermined according to overriding circuit design considerations.

As mentioned above, cross-talk interference may occur between two transmission signal traces. For example, a transmission signal on one of the transmission signal traces may cause noise on an adjacent transmission signal trace through electromagnetic coupling. One method of preventing such cross-talk is discussed in U.S. Pat. No. 6,531,932, to Govind et al. (hereinafter "Govind"), which provides noise shielding between signal traces by alternately interspersing guard traces between adjacent signal traces. Because the presence of the guard traces along the length of the signal traces affects the impedance of the signal traces, Govind addresses adjusting the widths of the signal traces to provide impedance matching.

One problem with the method discussed in Govind is that it does not address the possibility of various types of impedance discontinuities, such as bends that cause fringing electric fields, which are not affected by the disclosed guard traces. Furthermore, the noise shielding techniques in Govind fail to solve the problems presented when the physical attributes of the signal traces have already been established. Another problem with the method of Govind is that it places guard traces along substantially the entire length of the traces and adjust the widths of the signal traces. Such a design method may negatively impact other design parameters, including trace routing, overall circuit size, and cost.

BRIEF DESCRIPTION OF THE DRAWINGS

Embodiments of the present invention are illustrated by way of example and not intended to be limited by the figures of the accompanying drawings, in which.

DETAILED DESCRIPTION

In the following detailed description, numerous specific details are set forth in order to provide a thorough understanding of the invention. However, it will be understood by those skilled in the art that certain embodiments of the present invention may be practiced without these specific details. In other examples, well-known methods, procedures, components, and circuits have not been described in detail so as not to obscure the presented embodiments of the invention.

Transmission line impedance matching is described for matching an impedance discontinuity on a transmission signal trace. The apparatus includes a transmission signal trace and a non-transmission trace. The transmission signal trace has an impedance discontinuity, a first length, and a predetermined first width. The non-transmission trace is disposed near the transmission signal trace at a region corresponding to the impedance discontinuity. The non-transmission trace has a second length that is substantially less than the first length of the transmission signal trace. Additionally, the non-transmission trace is configured to be electromagnetically coupled to the transmission signal trace in the presence of a current on the transmission signal trace to provide a matched impedance on the transmission signal trace.

Figure 3A:
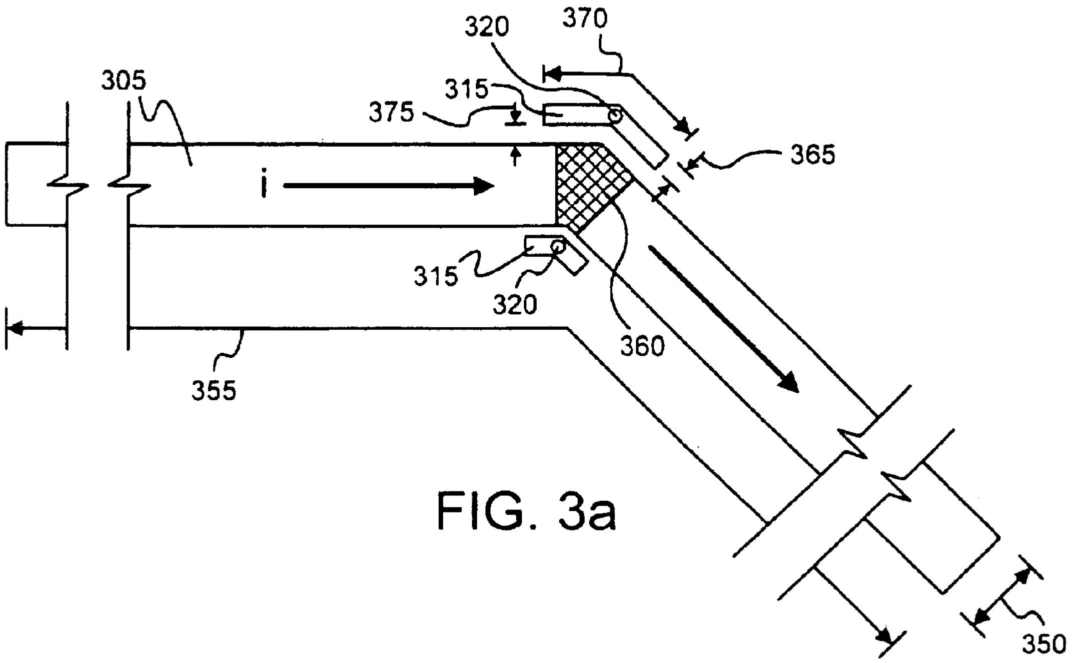
FIG. 3*a* illustrates a plan view of one embodiment of a transmission signal trace and localized non-transmission signal traces.

FIG. 3*a* illustrates a plan view of one embodiment of a transmission signal trace 305 and localized non-transmission signal traces 315. The transmission signal trace 305 is designed to propagate a transmission signal, such as a data-bearing transmission signal. Propagation of the transmission signal through the transmission signal trace 305 occurs through electromagnetic waves that are created when current passes through the transmission signal trace 305.

The illustrated transmission signal trace 305 has a width 350 and a length 355. In one embodiment, these physical attributes are determined at the time the overall circuit is designed. In another embodiment, the width 350 and length 355 of the transmission signal trace 305 are predetermined before the addition of any non-transmission traces, in either design or production. In one embodiment, the width 350 of the transmission signal trace 305 may be approximately in the range of 30–50 microns. In another embodiment, the width of the transmission signal trace 305 may be greater than or less than 30–50 microns.

Figure 2A:
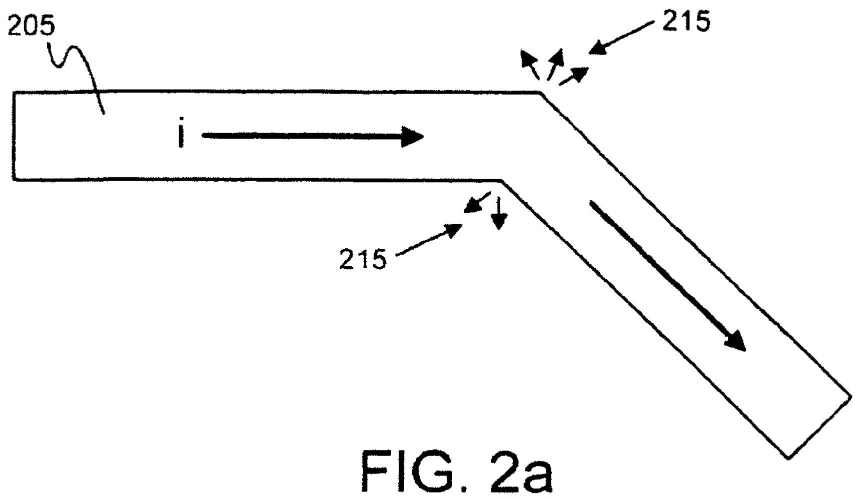
FIG. 2a Prior Art
FIG. 2*a* illustrates a plan view of a transmission signal trace having an impedance discontinuity.
Figure 2B:
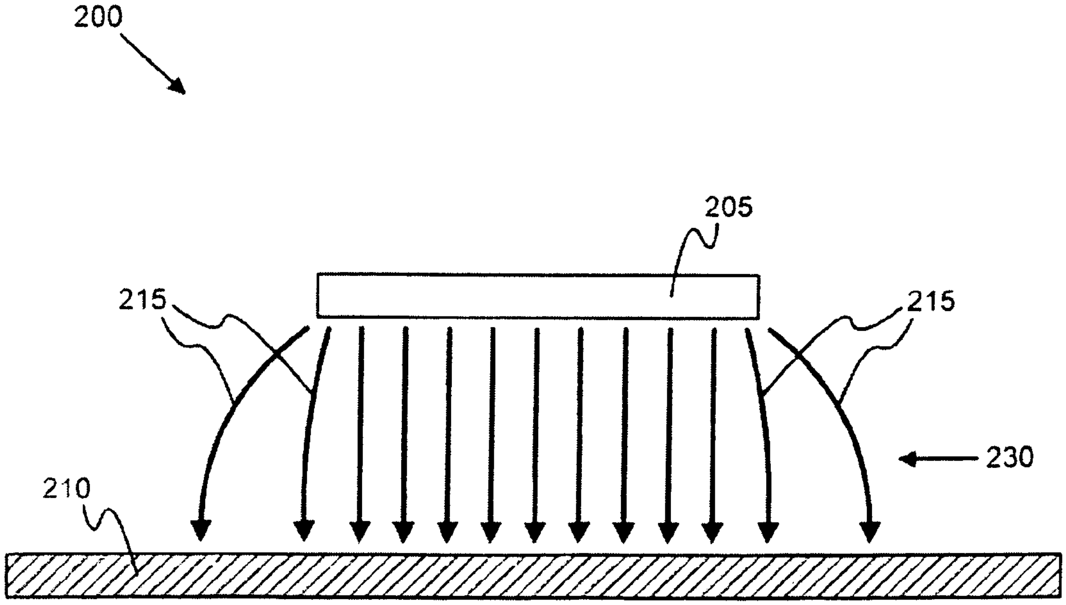
FIG. 2b Prior Art
FIG. 2*b* illustrates a fringing electric field of a transmission signal trace having an impedance discontinuity.

As illustrated, the transmission signal trace 305 includes a physical discontinuity that is representative of an impedance discontinuity. The physical discontinuity is apparent in the form of a sharp bend 360 (the approximate location is shown cross-hatched). The depicted physical discontinuity is only representative, but not limiting, of an impedance discontinuity that may result from the sharp bend 360 and/or other sources of impedance discontinuity. As stated above, the electromagnetic wave patterns of the transmission signal on the transmission signal trace 305 may be distorted due to the impedance discontinuity. Specifically, the impedance discontinuity may cause a fringing electric field (e.g., as illustrated in FIG. 2*b*), diffraction, reflection, and so forth.

FIG. 3*a* also includes a plurality of non-transmission traces 315 that are adjacent to, but physically separated from, the transmission signal trace 305. In particular, the non-transmission traces 315 are disposed near the transmission signal trace 305 at a region near the physical discontinuity. In the same manner, the non-transmission traces 315 are at a region corresponding to the impedance discontinuity because the impedance discontinuity results from the physical discontinuity.

Each non-transmission trace 315 has a width 365 and a length 370. In one embodiment, the width 365 of a non-transmission trace 315 may be approximately the same as the width 350 of the transmission signal trace 305. Alternatively, the non-transmission trace 315 may have a larger or smaller width 365.

In a similar manner, the length 370 of a non-transmission trace 315 may vary depending on the other dimensions and spacing of the non-transmission trace 315. The length 370 of the non-transmission trace 315 also may depend on the type or intensity of the corresponding impedance discontinuity. In one embodiment, the length 370 of the non-transmission trace 315 is approximately within the range of three to five times the width 350 of the transmission signal trace 305 and approximately centered in line with the physical discontinuity (i.e., bend 360, taper, etc.) or other source of the impedance discontinuity.

Alternatively, the length 370 and location of the non-transmission trace 315 may vary to satisfy design, manufacturing, or other considerations. In one embodiment, a non-transmission trace 315 may run a substantial length of the transmission signal trace 305, especially where a transmission signal trace 305 has a relatively short length 355 compared to its width 350. A non-transmission trace 315 that is located near an impedance discontinuity and has a length 370 that is appreciably less than the length 355 of the transmission signal trace 305 may be referred to as a localized non-transmission trace 315.

One advantage of providing a localized non-transmission trace 315 at a location near an impedance discontinuity on a transmission signal trace 305 is minimization of related production costs. By providing a localized non-transmission trace 315, rather than a lengthy guard trace for example, the production costs may be minimized in at least two ways. First, the material required to form the non-transmission traces 315 is minimized. Second, the total surface area required for a carrier substrate 300 is minimized, for example, avoiding unnecessary expansion of the overall design of the carrier substrate 300 or, in the alternative, reserving more surface area for additional data-bearing transmission signal traces 305. In certain embodiments, the non-transmission traces 315 may be confined to otherwise unused surface areas on a carrier substrate 300 and, thereby, have no negative effect on either the surface area of the carrier substrate 300 or potentially desired design of the circuit.

Although one non-transmission trace 315 is located on each side of the transmission signal trace 305 in FIG. 3*a*, alternative embodiments may include fewer or more non-transmission traces 315 on one or both sides of the transmission signal trace 305. For example, in one embodiment, a single non-transmission trace 315 may be located on one side or the other of the transmission signal trace 305. Alternatively, a plurality of non-transmission traces 315 may be located on a single side of the transmission signal trace 305. In another embodiment, an equal number of non-transmission traces 315 may be located on each side of the transmission signal trace 305. In another embodiment, a plurality of non-transmission traces 315 may be located on one or both sides of the transmission signal trace 305.

The non-transmission traces 315 may be of the same size or of varying sizes. Additionally, the non-transmission traces 315 may be located equal or varying distances 375 from the transmission signal trace 305. The distance 375 between the non-transmission trace 315 and the transmission signal trace 305 may be referred to as a lateral spacing 375. In one embodiment, the lateral spacing 375 between the transmission signal trace 305 and a non-transmission trace 315 may be approximately within the range of 15–20 microns. Alternatively, a non-transmission trace 315 may be located closer to or farther from the transmission signal trace 305. In another embodiment, the lateral spacing 375 may vary over the length 370 of the non-transmission trace 315.

Figure 3B:
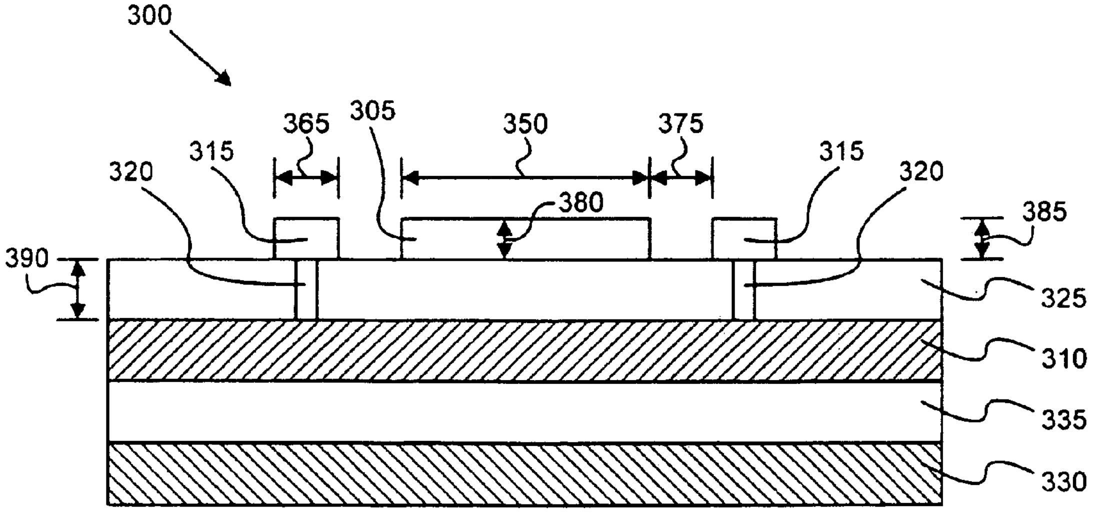
FIG. 3*b* illustrates a cross-sectional view of one embodiment of a carrier substrate having a transmission signal trace and a localized non-transmission signal trace.

Each of the non-transmission traces 315 illustrated in FIGS. 3*a* and 3*b* also includes a via 320. The vias 320 are indicated by circles within each of the non-transmission traces 315 in FIG. 3*a*. These vias 320 are more clearly depicted in FIG. 3*b*, which illustrates a cross-sectional view of a carrier substrate 300 having a transmission signal trace 305 and non-transmission traces 315. The carrier substrate 300 of FIG. 3*b* also may include a reference plane 310 and a dielectric layer 325. In another embodiment, a power plane 330 and another dielectric layer 335 also may be provided. In one embodiment, the carrier substrate 300 may be an integrated circuit (IC) package. Alternatively, the carrier substrate 300 may represent a circuit board, for example a mother board, a daughter card, a line card, or other type of structure that employs traces.

The cross-sectional view presented in FIG. 3*b* illustrates a thickness 380 of the transmission signal trace 305. In one embodiment, the thickness 380 of the transmission signal trace 305 may be approximately within the range of 15–20 microns. Alternatively, the thickness 380 of the transmission signal trace 305 may be greater than or less than 15–20 microns.

FIG. 3*b* also illustrates a thickness 385 of the non-transmission traces 315. In certain embodiments, the non-transmission traces 315 may have a thickness 385 that is greater than, less than, or approximately equal to the thickness 380 of the transmission signal trace 305. For example, the thickness 385 of the non-transmission traces 315 may be approximately within the range of 15–20 microns.

Additionally, each non-transmission trace 315 may be formed of an electrically conductive material. In one embodiment, a non-transmission trace 315 may be produced of the same type of conductive material that makes up the transmission signal trace 305. The non-transmission traces 315 also may be formed using the same process as is used to form the transmission signal trace 305. For example, the transmission signal trace 305 and corresponding non-transmission traces 315 may be formed on a dielectric layer 325 using a photolithographic technique or any other known trace production technique.

As depicted in FIG. 3*b*, the transmission signal trace 305 and the non-transmission traces 315 are disposed on the dielectric layer 325 that is interposed between the transmission signal trace 305 and the reference plane 310. In one embodiment, the thickness 390 of the dielectric layer 115 may be approximately 30 microns. Alternatively, the dielectric layer 115 may have a thickness 390 that is greater or less than 30 microns.

In one embodiment, and as described herein, the reference plane 310 is a ground plane. Alternatively, the reference plane 310 may be a power plane. In another embodiment, the carrier substrate 300 may include a power plane 330 separated from the reference ground plane 310 by another dielectric layer 335. Alternative embodiments may include fewer or more ground planes 310, power planes 330, and/or dielectric layers 325, 335. For example, the carrier substrate 300 may a single-sided or double-sided carrier substrate implementation. Additionally, the relative locations of the ground plane 310, power plane 330, and dielectric layers 325, 335 may vary.

In the same way, vias 320 may be provided to connect the non-transmission traces 315 to a reference plane 310. The reference plane 310 may be one or several layers away from the non-transmission traces 315. Although a single via 320 is shown for each non-transmission trace 315, alternative embodiments may provide additional vias 320 for one or more non-transmission traces 315. As shown in FIG. 3*b*, the vias 320 pass through the dielectric layer 325, which is interposed between the non-transmission trace 315 and the reference plane 310.

Figure 1:
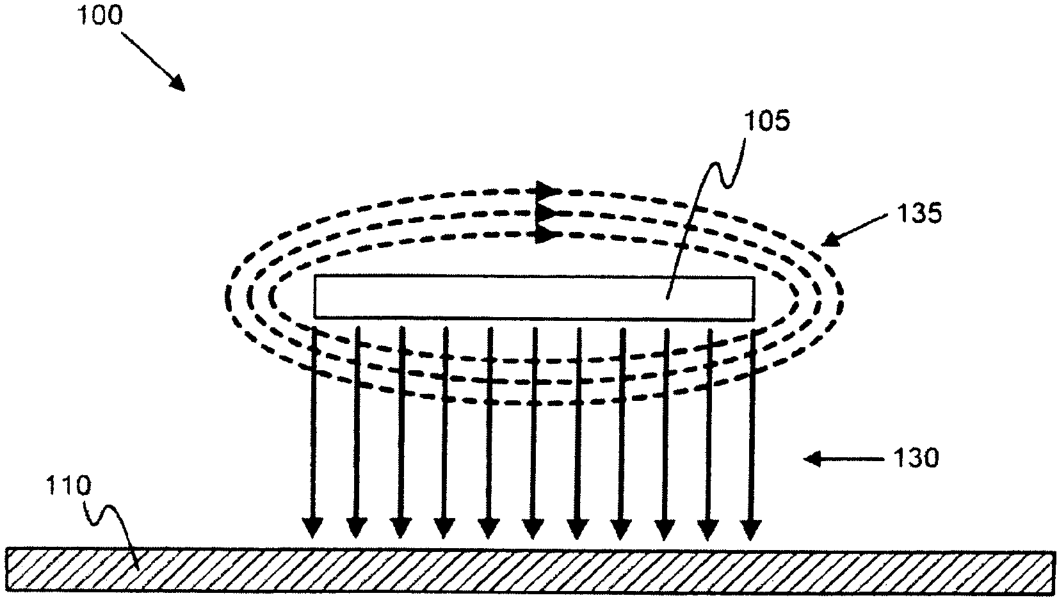
FIG. 1 Prior Art
FIG. 1 illustrates electromagnetic fields of a transmission signal trace.
Figure 3C:
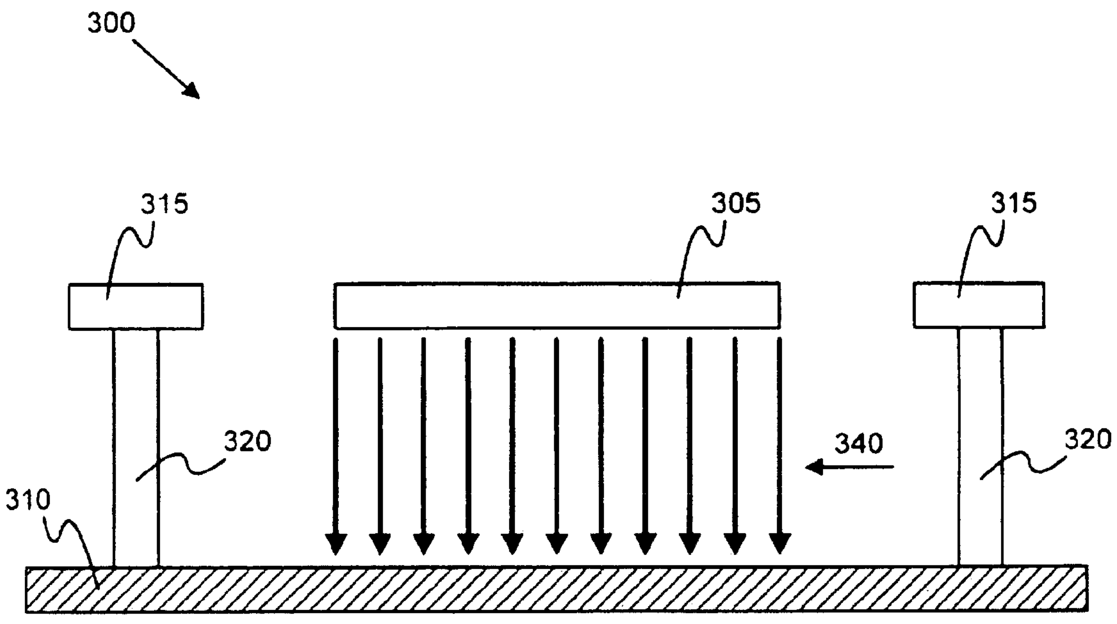
FIG. 3*c* illustrates one embodiment of an electric field about a transmission signal trace having localized non-transmission signal traces.

FIG. 3*c* illustrates one embodiment of an electric field 340 about a transmission signal trace 305 having localized non-transmission signal traces 315. For clarity, the power plane 330 and dielectric layers 325, 335 are not shown in this figure. A representative electric field 340 is shown between the transmission signal trace 305 and the reference plane 310 at the location of the impedance discontinuity. The electric field 340 exists within the dielectric layer 325 and does not include a fringing electric field 215 because of the presence of the non-transmission traces 315, despite the impedance discontinuity on the transmission signal trace 305. In particular, the non-transmission traces 315 serve to attract away undesirable fringing electric fields 215 and corresponding magnetic fields so that the remaining electric field 340 is substantially similar to a representative electric field 130 shown in FIG. 1.

Figure 4A:
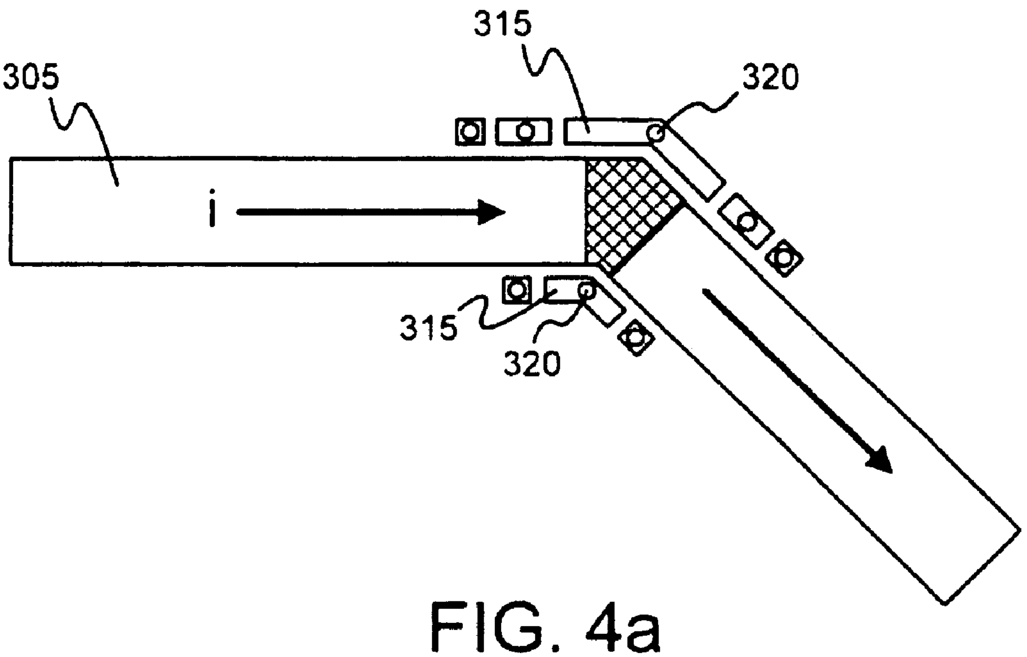
FIG. 4*a* illustrates one embodiment of rectangular and angular non-transmission signal traces.
Figure 4B:
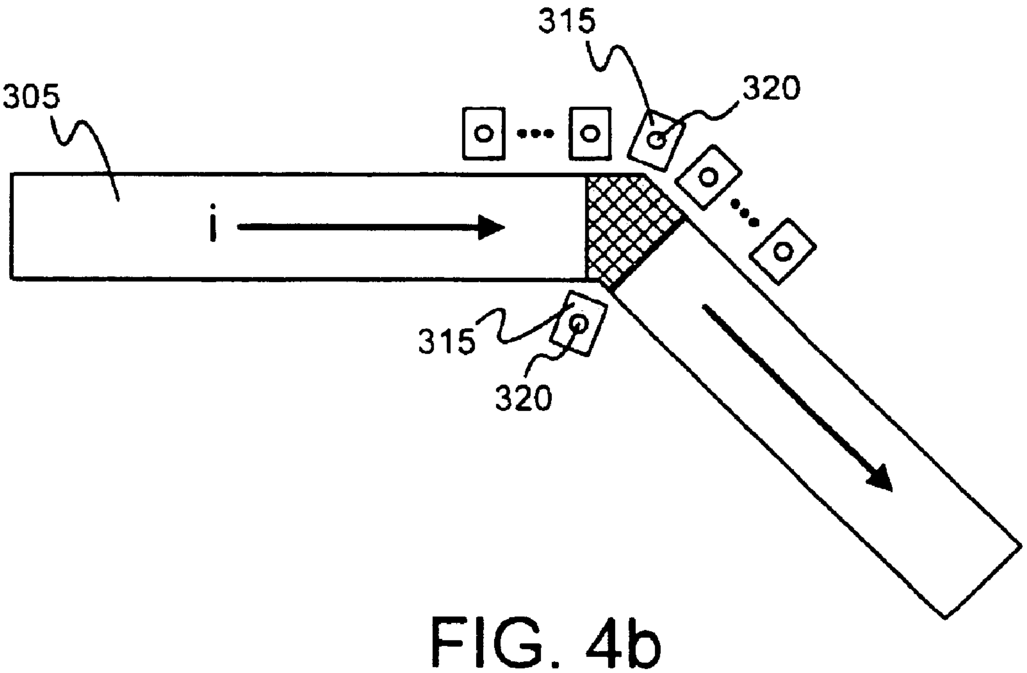
FIG. 4*b* illustrates one embodiment of rectangular non-transmission signal traces.
Figure 4C:
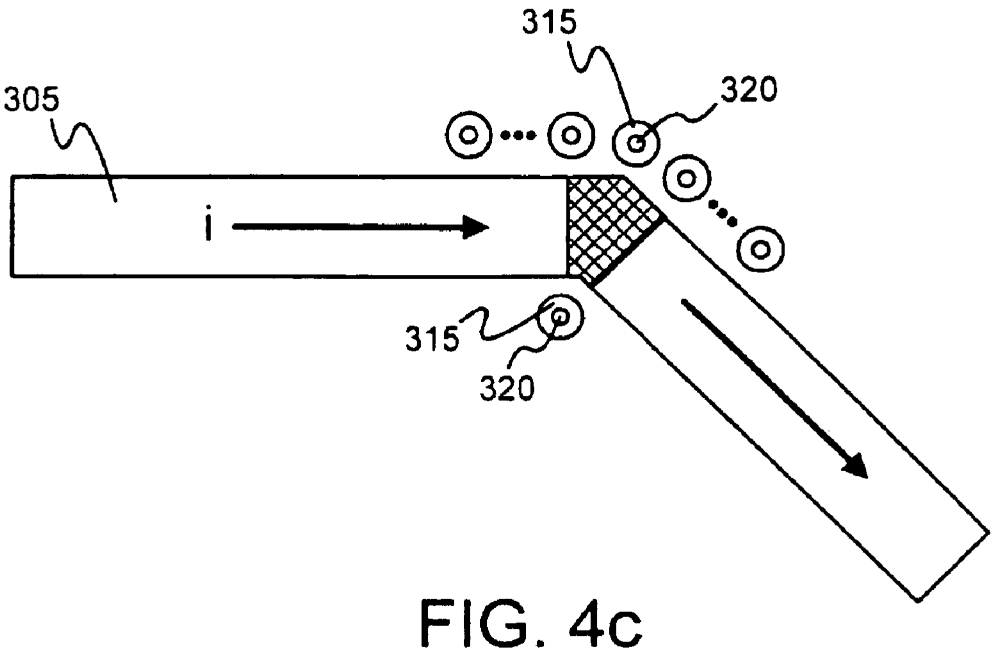
FIG. 4*c* illustrates one embodiment of circular non-transmission signal traces.
Figure 4D:
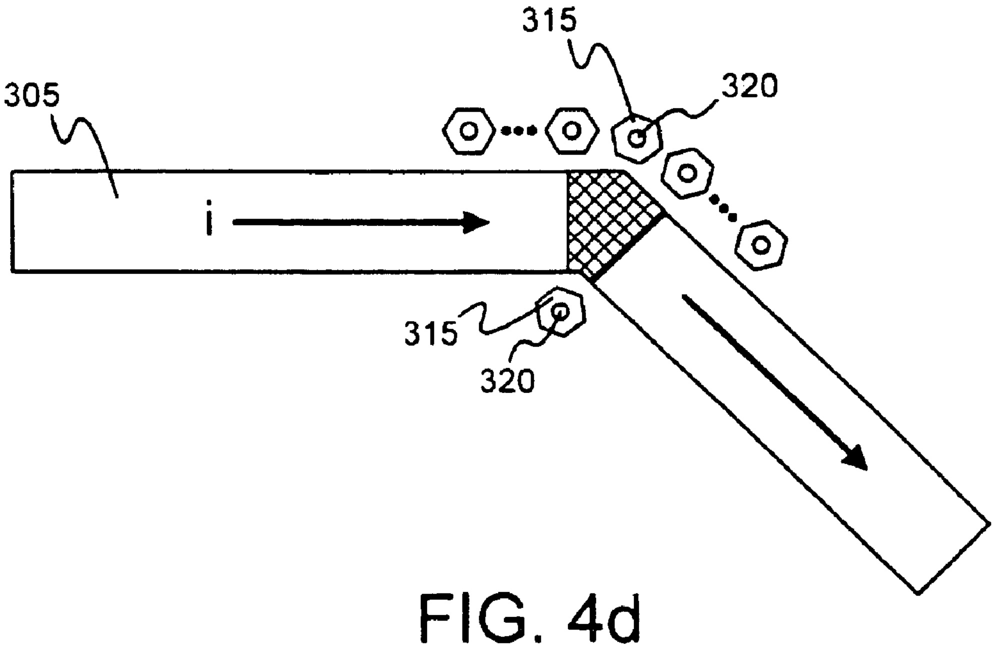
FIG. 4*d* illustrates one embodiment of hexagonal non-transmission signal traces.
Figure 4E:
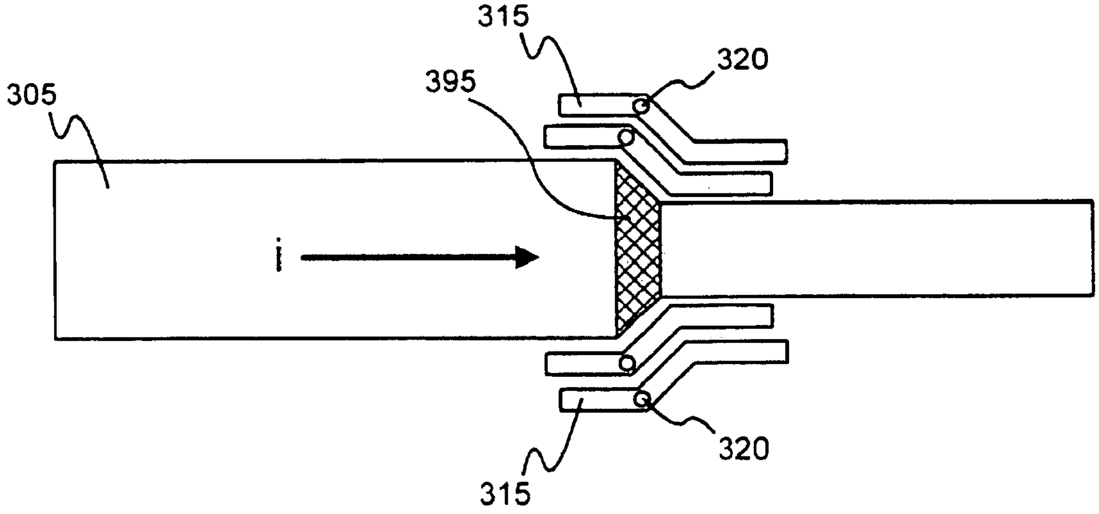
FIG. 4*e* illustrates one embodiment of contoured parallel non-transmission signal traces.

FIGS. 4*a* through 4*e* illustrate various alternative embodiments of non-transmission signal traces 315 that may be used independently or in conjunction with one another. As described above, the physical bend 360 depicted in FIGS. 4*a* through 4*d* and the physical taper 395 depicted in FIG. 4*e* are representative, but not limiting, of an impedance discontinuity that may exist on the transmission signal trace 305.

In each of the following illustrations, one or more non-transmission traces 315 are disposed adjacent to a transmission signal trace 305. Although non-transmission traces 315 are shown on both sides of a transmission signal trace 305, alternative embodiments may include fewer or more non-transmission traces 315 on one or both sides of the transmission signal trace 305. Additionally, each of the non-transmission traces 315 is shown having a single via 320 to provide a connection to a reference plane 310. However, more than one via 320 may be provided for each non-transmission trace 315, as described above.

Where multiple non-transmission traces 315 are disposed near a single transmission signal trace 305, the non-transmission traces 315 may be sized and located so as to form a pattern. Alternatively the non-transmission traces 315 may be located in a manner that is not readily discernable as a pattern. Additionally, in certain embodiments, the length and width of each non-transmission trace 315 may be independent of the physical attributes of any other non-transmission trace 315. Furthermore, the spacing among the several non-transmission traces 315 and between each non-transmission trace 315 and the transmission signal trace 305 may be independently varied.

FIG. 4*a* specifically depicts a plurality of rectangular and angular non-transmission traces 315 on either side of a transmission signal trace 305. The angled non-transmission traces 315 are provided on each side of the transmission signal trace 305 at the region corresponding to the physical discontinuity.

FIG. 4*b* specifically depicts several rectangular non-transmission traces 315 on one side of the transmission signal trace 305 and a single rectangular non-transmission trace 315 on the opposite side of the transmission signal trace 305. FIGS. 4*c* and 4*d* are similar to FIG. 4*b*, except that FIGS. 4*c* and 4*d* depict circular and hexagonal non-transmission traces 315, respectively. In another embodiment, the non-transmission traces 315 may have other canonical shapes (triangle, oval, diamond, etc.) and/or non-canonical shapes (wave, zigzag, etc.).

FIG. 4*e* specifically depicts a plurality of non-transmission traces 315 that follow the contour of both sides of a transmission signal trace 305 that has a physical discontinuity in the form of a taper 395. In one embodiment, a single non-transmission trace 315 may be disposed on each side of the transmission signal trace 305. In an alternative embodiment, multiple non-transmission traces 315 may be provided, as shown, in parallel or in a staggered manner. In yet another embodiment, the contoured non-transmission traces 315 may follow the contour of any shape of transmission signal trace 305, including curved, stubbed, tapered, and so forth.

Figure 5:
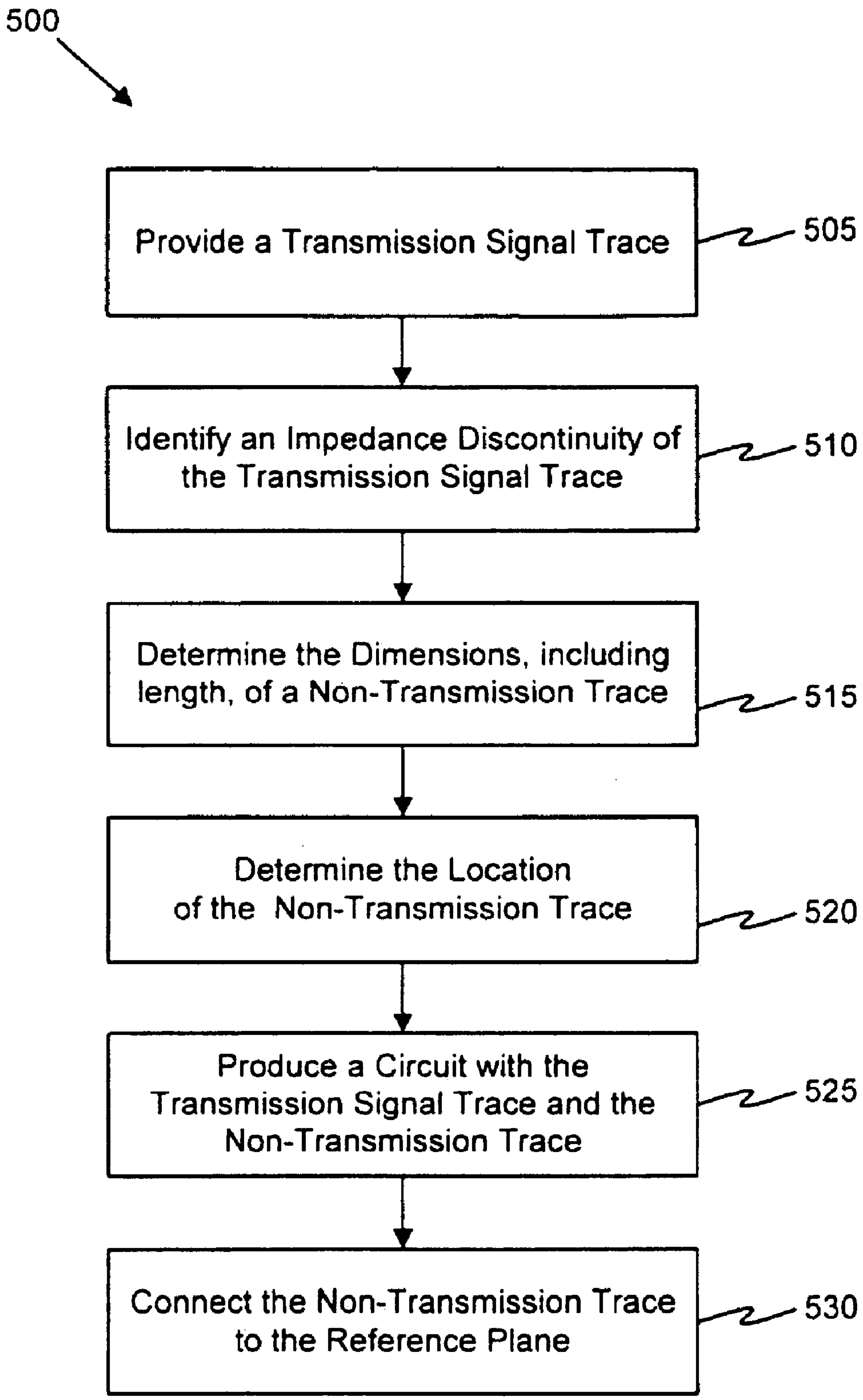
FIG. 5 illustrates one embodiment of an impedance matching method.

FIG. 5 illustrates one embodiment of an impedance matching method 500. In one embodiment, the impedance matching method 500 may employ a non-transmission trace 315 to provide impedance matching on a transmission signal trace 305. Although the impedance matching method 500 is shown in the form of a flow chart having separate blocks and arrows, the operations described in a single block do not necessarily constitute a process or function that is dependent on or independent of the other operations described in other blocks. Furthermore, the order in which the operations are described herein is only illustrative, and not limiting, as to the order in which such operations may occur in alternative embodiments. For example, some of the operations described may occur in series, in parallel, or in an alternating and/or iterative manner.

The illustrated impedance matching method 500 begins by providing a transmission signal trace 305, block 505. Providing a transmission signal trace 305, in one embodiment, may constitute designing a transmission signal trace having a predefined physical attribute, such as a length 355, width 350, thickness 380, and so forth. Alternatively, providing a transmission signal trace 305 may include forming the transmission signal trace 305 on a dielectric layer 325 or within a carrier substrate 300.

After providing a transmission signal trace 305, the depicted impedance matching method 500 provides for identifying an impedance discontinuity of the transmission signal trace 305, block 510. In one embodiment, an impedance discontinuity may be identifiable by a physical characteristic, such as a bend 360 or taper 395, that is known to produce an impedance discontinuity. In another embodiment, an impedance discontinuity may be identifiable by performing analysis of a design of the transmission signal trace 305. Alternatively, an impedance discontinuity may be identifiable by testing the transmission signal trace 305 or a similar circuit.

The impedance matching method 500 continues by determining the dimensions of a non-transmission trace 315, block 515. Such a calculation may take into account certain design and manufacturing constraints, including the physical attributes of the various layers. The calculated dimensions of the non-transmission trace 315 may include length 370, width 365, thickness385, and so forth. In another embodiment, the physical dimensions of each of a plurality of non-transmission traces 315 may be determined.

Various lengths for each non-transmission trace 315 may be employed in certain embodiments of the non-transmission traces 315. For example, the length 370 of a non-transmission trace 315 may be approximately within a range of three and five times the width 350 of the transmission signal trace 305. Where the width 350 of the transmission signal trace 305 varies, such as with a taper 395, the pertinent width 350 may be the narrower width 350, the wider width 350, or an average width 350 associated with the taper 395. In another embodiment, the length 370 of the non-transmission trace 315 may be approximately within a range of one and ten times the width 350 of the transmission signal trace 305. In another embodiment, the length 370 of the non-transmission trace 315 may be less than or greater than the ranges presented above.

The length of the non-transmission trace 315 alternatively may be determined relative to the length 355 of the transmission signal trace 305. In one embodiment, the length 370 of the non-transmission trace 315 may be substantially less than the length 355 of the transmission signal trace 305. As used herein, the term “substantially less than” is understood to mean less than by a fraction that is not de minimis. In other words, the length 370 of the non-transmission trace 315 may depend on the length 355 of the transmission signal trace 305.

For example, where the length 355 of the transmission signal trace 305 is relatively long compared to its width 350, for example, the fraction by which the length 370 of the non-transmission trace 315 is shorter may be approximately 25% or more. In other words, the length 370 of the non-transmission trace 315 may be approximately 75% or less of the length 355 of the transmission signal trace 305.

However, where the length 355 the transmission signal trace 305 is not very long compared to its width 350, for example, the fraction by which the length 370 of the non-transmission trace 315 is shorter may be approximately 5% or more. In other words, the length 370 of the non-transmission trace 315 may be approximately 95% or less of the length 355 of the transmission signal trace 305. In alternative embodiments, the relevant fraction may be greater than or less than the examples provided above. Similarly, the corresponding lengths 370 of the non-transmission traces 315 may be less than or greater than the examples provided above.

The length 370 of the non-transmission trace 315 alternatively may be determined relative to an effective length of the impedance discontinuity. As used herein, the effective length of the impedance discontinuity is understood to be the approximate length along the transmission signal trace 305 through which the effects of the impedance discontinuity, i.e. diffraction, reflection, fringing electric fields, etc., may be present. Referring to the figures, the effective length of a sharp bend 360 may correspond to the cross-hatched portions shown in FIGS. 3*a* and 4*a*–4*d*. Similarly, the effectively length of a taper 395 may correspond to the cross-hatched portion shown in FIG. 4*e*. In one embodiment, the effective length of the impedance discontinuity may be determined through design analysis. Alternatively, the effective length may be determined through testing and measurements.

In conjunction with determining the dimensions of a non-transmission trace 315, the impedance matching method 500 provides for determining a relative location of the non-transmission trace 315, block 520. In one embodiment, the determined location of the non-transmission trace 315 is at a region that corresponds to the impedance discontinuity of the transmission signal trace 305. In another embodiment, the location of each of a plurality of non-transmission traces 315 may be determined.

Once the number, dimensions, and locations of the non-transmission traces 315 are determined, the impedance matching method 500 continues with the production of the circuit having both the transmission signal trace 305 and the non-transmission traces 315, block 525. Additionally, the non-transmission traces 315 may be connected to the reference plane 310, block 530, in conjunction with the production of the circuit.

In one embodiment, the transmission signal trace 305 and non-transmission signal traces 315 may be produced on a carrier substrate 300, as described above. In one embodiment, the carrier substrate 300 may be an integrated circuit (IC) package. Alternatively, the carrier substrate 300 may represent a circuit board, for example a mother board, a daughter card, a line card, or other type of structure that employs traces.

In the foregoing specification, the invention has been described with reference to specific exemplary embodiments thereof. It should be appreciated that reference throughout this specification to "one embodiment" or "an embodiment" means that a particular feature, structure, or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures, or characteristics may be combined as suitable in one or more embodiments of the invention.

It will, however, be evident that the invention is not limited to the embodiments described herein. Various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method, comprising:

providing a transmission signal trace, the transmission signal trace having an impedance discontinuity, a first length, and a first width, wherein the impedance discontinuity results from a discontinuity in the transmission signal trace other than a junction between the transmission signal trace and another electrical transmission line;

determining a second length of a non-transmission trace, wherein the second length of the non-transmission trace is substantially less than the first length of the transmission signal trace;

predetermining the first width of the transmission signal trace prior to determining the second length of the non-transmission; and determining a location to dispose the non-transmission trace near the transmission signal trace to electromagnetically couple the non-transmission trace to the transmission signal trace at a region corresponding to the impedance discontinuity in the presence of a current on the transmission signal trace.

2. The method of claim 1, further comprising determining the second length of the non-transmission trace to be approximately three to five times the predetermined first width of the transmission signal trace.

3. The method of claim 1, further comprising determining the second length of the non-transmission trace to be less than approximately 50% of the first length of the transmission signal trace.

4. The method of claim 1, further comprising determining the second length of the non-transmission trace to be greater than approximately an effective length of a fringing electric field produced by a transmission signal on the transmission signal trace.

5. The method of claim 1, further comprising determining the second length of the non-transmission trace to be less than approximately an effective length of a fringing electric field produced by a transmission signal on the transmission signal trace.

6. The method of claim 1, further comprising connecting the non-transmission trace to a reference plane by an electrical via, a dielectric layer interposed between the transmission signal trace and the reference plane.

7. The method of claim 1, further comprising disposing the transmission signal trace and the non-transmission trace on a carrier substrate.

* * * * *

UNITED STATES PATENT AND TRADEMARK OFFICE

CERTIFICATE OF CORRECTION

PATENT NO. : 7,218,183 B2
APPLICATION NO. : 11/352182
DATED : May 15, 2007
INVENTOR(S) : Kim et al.

It is certified that error appears in the above-identified patent and that said Letters Patent is hereby corrected as shown below:

In column 2, at line 48, After first occurrence of “the” and insert --signal--.

In column 2, at line 48, delete “adjust” and insert --adjusts.--.

In column 2, at line 51, delete “cost” and insert --production cost.--.

Signed and Sealed this

Eleventh Day of November, 2008

JON W. DUDAS
*Director of the United States Patent and Trademark Office*